United States Patent [19]

Young

[11] Patent Number: 4,816,531

[45] Date of Patent: Mar. 28, 1989

[54] BISMALEIMIDE RESIN COMPOSITION CONTAINING EPOXY RESIN AND A PHENOLIC CURING AGENT THEREFOR

[75] Inventor: Glenda C. Young, Houston, Tex.

[73] Assignee: Shell Oil Company, Houston, Tex.

[21] Appl. No.: 175,652

[22] Filed: Mar. 15, 1988

Related U.S. Application Data

[63] Continuation of Ser. No. 11,164, Feb. 5, 1987, abandoned.

[51] Int. Cl.4 ............... C08G 59/58; C08G 59/40
[52] U.S. Cl. ........................ 525/488; 525/502; 528/104; 528/117
[58] Field of Search ........... 525/488, 502; 528/104, 528/117

[56] References Cited

U.S. PATENT DOCUMENTS

| | | | |
|---|---|---|---|
| 4,128,598 | 12/1978 | Makino | 528/98 |
| 4,296,219 | 10/1981 | Takahashi | 525/488 |
| 4,510,272 | 5/1985 | Loszewski | 528/117 |

FOREIGN PATENT DOCUMENTS

60-260627 of 1985 Japan ................... 525/482

Primary Examiner—John Kight
Assistant Examiner—Frederick F. Krass

[57] ABSTRACT

A curable composition is provided comprising a bismaleimide resin, an epoxy resin, and a phenolic resin curing agent. The composition can also contain an accelerator for enhanced low-temperature cure. The composition is useful for high-performance applications such as electrical lamination and filament-wound parts.

9 Claims, No Drawings

BISMALEIMIDE RESIN COMPOSITION CONTAINING EPOXY RESIN AND A PHENOLIC CURING AGENT THEREFOR

This is a continuation of application Ser. No. 011,164, filed Feb. 5, 1987 now abandoned.

BACKGROUND OF THE INVENTION

This invention relates to thermosettable resin compositions. In one aspect, the invention relates to bismaleimide resin compositions having improved composites laminating properties.

Bismaleimide resins are thermosettable materials useful in high-temperature electrical and structural applications. Bismaleimides are known to have excellent high-temperature properties but have been found difficult to process in applications requiring impregnation of a fibrous substrate with the resin, as is necessary for electrical and structural composites applications. The processing difficulties are to some extent the result of the limited solubility of bismaleimides in conventional organic solvents. Problems associated with such processing and solubility difficulties include inconsistent cure behavior and excessively long cure times, resulting in laminates prepared from unmodified bismaleimides which have poor copper adhesion and after-cure brittleness.

Bismaleimide resins have been modified with epoxy resins to improve processing characteristics. In such bismaleimide/epoxy compositions, it is necessary to provide a curing agent for the epoxy resin. Aromatic amines have been used as curing agents in epoxy-modified bismaleimide compositions, but such aromatic amine-cured systems have certain property weaknesses for electrical laminating applications. For example, such systems lack long-term stability, resulting in short shelf life for the resin solutions, difficulty in establishing operational conditions for preparing prepregs and inconsistent properties in the final laminates.

It is therefore an object of the invention to provide high-temperature bismaleimides resin compositions having good processability and stability for laminating and composites applications.

SUMMARY OF THE INVENTION

According to the invention, a composition is provided comprising a bismaleimide resin, an epoxy resin and a phenolic curing agent for the epoxy resin. The composition can contain an optional cure accelerator and a suitable solvent for applications such as prepregging.

DETAILED DESCRIPTION OF THE INVENTION

The invention composition includes a bismaleimide. The preferred bismaleimides resin are N,N'-unsaturated bismaleimides which can be represented by the formula

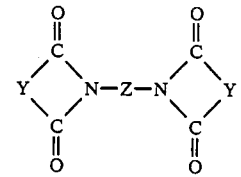

in which Y is a substituted or unsubstituted divalent radical having at least 2 carbon atoms, preferably 2 to 6 carbon atoms, containing a carbon-carbon double bond, and Z is a divalent radical containing from about 2 to about 40 carbon atoms. Z can be aliphatic, cycloaliphatic, aromatic or heterocyclic. Z can include heteroatoms and can be substituted or unsubstituted. Examples of bismaleimides which can be employed are N,N'-bismaleimides of ethylene diamine, hexamethylene diamine, phenylene diamine, trimethylhexamethylene diamine, methylene dianiline, toluene diamine, 4,4'-diphenylmethane diamine, 3,3'-diphenylsulfone diamine, 4,4'-diphenylether diamine, 4,4'-dicyclohexanemethane diamine, metaxylylene diamine, and 4,4'-diphenylcyclohexane diamine. Various N,N'-bismaleimides are disclosd in U.S. Pat. Nos. 3,562,223, 4,211,860, and 4,211,861, the disclosures of which are hereby incorporated by reference. The N,N'-unsaturated bismaleimides are preferably derived from at least one aromatic diamine. The preferred bismaleimide is N,N'-4,4'-diphenylmethane bismaleimide. The bismaleimide can contain various additives as processing aids. Suitable N,N'-unsaturated bismaleimides are available commercially from Boots-Technochemie as Compimide ® resins, for example.

The invention composition includes an epoxy resin. The epoxy resin can be any curable epoxy resin having, on the average, more than about 1.75 vicinal epoxide groups per molecule. The epoxy resin can be saturated or unsaturated, aliphatic, cycloaliphatic, aromatic or heterocyclic, and may bear substituents which do not materially interfere with the curing reaction. Such substituents, for flame-proof applications, can include bromine. They may be monomeric or polymeric. They can be liquid or solid, but are preferably solid at room temperature. Suitable epoxy resins include glycidyl ethers prepared by reacting epichlorohydrin with a compound containing at least one hydroxyl group carried out under alkaline reaction conditions. The epoxy resin products obtained when the hydroxyl group containing compound is bisphenol-A are represented below by structure I in which n is a number in the range of 0 to 10, usually 0 to 2. An example of a suitable epoxy resin component is EPON ® Resin 1123-A-80, a

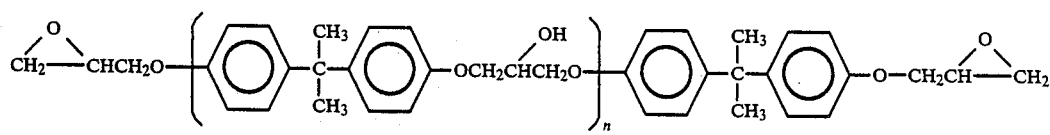

I brominated diglycidyl ether of bisphenol-A having a molecular weight of about 820. Also suitable as the epoxy resin component are multifunctional glycidyl ethers of tetraphenol ethane, as represented below in structure II. Such multifunctional epoxy resins are available commercially as EPON ®1031 from Shell Chemical Company.

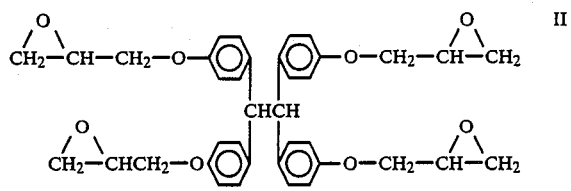

The presently preferred epoxy resin components of the invention composition are novolak-based epoxy resins (referred to herein as "novolak epoxy resins"), which are the glycidyl ethers of the product of reacting a phenol, such as phenol, resorcinol or bisphenol-A, with formaldehyde in acid solution. The preferred epoxy resins are solid bisphenol-A novolak epoxy resins having a molecular weight greater than about 300, preferably greater than about 500, weight per epoxide greater than about 175, and an epoxide functionality greater than about 1.75, preferably in the range of about 2 to about 5. Such novolak epoxy resins are available as Epikote DX-90 from Shell International Chemical Company.

The epoxy resin and the bismaleimide resin will generally be used in combination in any relative amounts within the weight ratios from about 10:90 to about 90:10 which produce the desired physical and chemical properties for the intended application. The invention composition including a bismaleimide resin, an epoxy resin and a phenolic curing agent is most suitable for making prepregs for electrical laminating and structural composites applications. For such applications, the bismaleimide resin will generally be present in an amount greater than about 50 weight percent, preferably about 50 to about 90 weight percent, most preferably about 60 to about 80 weight percent.

The invention composition will generally include a phenolic curing agent for the epoxy resin. The phenolic curing agent will preferably have a functionality greater than about 1.75. The preferred curing agents are phenolic novolacs prepared by reacting a dihydroxy phenol such as resorcinol or bisphenol-A with formaldehyde in acid solution. The preferred phenolic novolac resin curing agents are bisphenol-A novolacs having a weight per phenolic group of about 60 to about 500, preferably about 60 to about 300, and, on the average, more than about 2 phenolic hydroxyl groups per molecule. Such phenolic novolacs are available under the tradename Epikure ® DX-175 from Shell International Chemical Company. The phenolic novolac curing agent will be present in the composition in an amount effective to cure the epoxy resin, which will generally be a stoichiometric amount of about 0.75 to about 1.25 equivalents per equivalent of epoxy resin. In terms of weight percent, the curing agent will be present in an amount generally from about 10 to about 70 weight percent, preferably about 15 to about 50, most preferably about 20 to about 40, based on the combined weight of epoxy resin and curing agent.

The curing agent, for flame-proof applications, can be a mixture of the phenolic resin curing agent and a brominated phenolic curing agent such as brominated bisphenol-A. The brominated bisphenol-A will be present in an amount effective to increase flame retardancy, generally an amount up to about 40 weight percent, usually about 5 to about 15 weight percent, based on the combined weight of epoxy resin and curing agent(s).

In order to promote faster and/or lower temperature cure of the resin components of the composition, an optional cure accelerator may be used. Many suitable accelerators, such as tertiary amines, imidazoles, phosphenes, octoates and boron trifluorides for example, are known in the art. Because of their availability and performance characteristics, imidazoles such as 2-methyl imidazole, 2-methyl-4-ethyl imidazole and isopropyl imidazole, are preferred. The accelerator will be present in the composition in an amount effective to increase the cure rate and/or lower the cure temperature of the compositions, generally in an amount from about 0.01 to about 5, preferably from about 0.05 to about 2 weight percent, based on the weight of the epoxy, bismaleimide and curing agent components of the composition.

The invention composition can, for applications such as prepregging, include an organic solvent or diluent present in an amount effective to decrease the viscosity of the system for easier processing. Polar organic solvents such as ketones, alcohols and glycol ethers, for example, are suitable. Because of the different solubility characteristics of the bismaleimide resin and the epoxy resin, it has been found preferable to use a separate solvent for each resin and to mix the resins in solution. The preferred solvents for the epoxy resin component are ketones such as acetone, methyl ethyl ketone and methyl isobutyl ketone, for example. Because of its superior compatibility with the bismaleimide resin solution, methyl ethyl ketone is the preferred solvent for the epoxy resin component of the invention composition. The proportion of solid components in the composition will vary widely depending upon the amount of the other constituents present and the intended application of the composition, but for prepregging applications the solvent will generally constitute at least about 15 weight percent of the total weight of the epoxy solution. Preferably, the solvent will be present in the epoxy solution in an amount from about 15 to about 50, most preferably about 30 to about 45 weight percent. The epoxy resin can be stirred into the selected solvent at ambient temperature to form the epoxy solution.

For prepregging applications, the bismaleimide resin will also be used in the form of a solution of a polar organic solvent such as described above for the epoxy component. The preferred solvent for the bismaleimide resin is N,N-dimethyl formamide or blends of other organic solvents, such as isopropyl alcohol or N-methyl pyrrolidone, for example, with dimethyl formamide. The proportion of solid components in the bismaleimide solution will vary widely depending upon the amount of the other constituents present and the intended application of the composition, but for prepregging applications the bismaleimide solvent will generally constitute at least about 30 weight percent of the total weight of the bismaleimide solution. Preferably, the solvent will be present in the bismaleimide solution in an amount from about 20 to about 60, most preferably about 40 to about 50, weight percent. The solution can be formed by stirring the bismaleimide resin into the selected solvent with optional mild heating not greater than about 40° C.

The epoxy resin solution and the bismaleimide resin solution are then blended at ambient temperature along with optional added accelerator to make the "varnish," or prepregging composition. The resin blend solution can be stored at 55° C. for up to three days prior to use.

For preparation of reinforced laminates from the varnish, a substrate of glass, carbon, quartz, Kevlar, polyester or like material, in chopped, mat or woven form, is first impregnated with the varnish. A prepreg is formed by heating the impregnated substrate in a press or autoclave at a temperature sufficient to remove the solvent and to partially cure without gelaton, or "B-stage," the blended resin system, generally about 40° C. to about 180° C., preferably about 150° C. to about 175° C., for a time of up to about 10 minutes, preferably about 30 seconds to about 2 minutes. A laminate is fabricated by subjecting a set of layered prepregs to conditions effective to cure the resins and to integrate the prepregs into a laminated structure. The laminate can optionally include one or more layers of a conductive material such as copper. Laminating conditions generally include a time of about 30 minutes to about 4 hours, preferably about 1 hour to about 2 hours, a temperature of about 160° C. to about 300° C., preferably about 180° C. to about 210° C. and a pressure of about 50 to about 500 psi. The composition can also include optional constituents such as inorganic fillers and additional flame retardants, for example. The laminates can be optionally "post-cured" by heating at a temperature of about 200° to about 235° C. at ambient pressure for about 1 to 6 hours to improve thermal properties.

Laminates prepared from the invention composition have excellent high-temperature properties, including glass transition temperatures in the range of 170° to 300° C., optimally about 270° to about 300° C.; low coefficient of thermal expansion, for example about 55 to 80 ppm/°C.; good processing characteristics; good solvent resistance; high peel strength, generally greater than about 7 lbs/in; superior flexural properties generally greater than about 60,000 psi; and high flame retardancy. Prepregs made from the compositions are stable up to 90 days or more under normal storage conditions.

In addition to high-performance electrical laminates, the invention composition is useful for electrical component encapsulation, molding powders, coatings, and structural composites parts fabrication.

EXAMPLE 1

This example demonstrates preparation of a composition according to the invention. Part 1, an epoxy/phenolic solution, was prepared by mixing 35.3 weight percent of epoxidized bisphenol-A novolac (Epikote® DX-90 from Shell Chemical Company) with 13.4 weight percent of bisphenol-A novolac (Epikure DX-175 from Shell Chemical Company) and 11.3 weight percent of tetrabromobisphenol-A with 40 weight percent of methyl ethyl ketone until dissolved. The resulting 60 weight percent resin solids solution is stable at ambient temperatures for more than one month. The solution has physical properties as listed in Table 1.

Part 2 is prepared by mixing 60 parts of a commercial MDA-free hydrazide-modified bismaleimide resin with 40 parts of N,N'-dimethyl formamide until dissolved. The resulting solution is 60 weight percent resin solids and is stable at ambient temperatures in excess of one month. The physical properties of this solution are also listed in Table 1.

The two parts are then mixed together to yield a solution of 50 weight percent epoxy/phenolic solution to 50 weight percent imide solution. The resulting varnish solution is accelerated by adding 0.1 weight percent of 2-methylimidazole based on the resin solids of the solution. The varnish physical properties are listed in Table 1.

A prepreg was prepared by impregnating a fiberglass mat with the above varnish system in approximately a 1:1 weight ratio of varnish to glass. The impregnated glass was heated in a hot air convection oven at 163° C. for about 2.2 minutes.

An 8-ply, 12×12 inch laminate was then prepared from 8 prepregs cured in a press at 180° C. and 50 psi for 60 minutes. The resulting laminate board was postcured at 200° C. for 2 hours in a forced draft oven. The laminate had the properties shown in Table 2, column 1.

EXAMPLE 2

This example demonstrates the preparation of a composition according to the invention. Part 1, an epoxy/phenolic solution, is prepared by mixing 35.3 weight percent of epoxidized bisphenol-A novolac (Epikote DX-90 from Shell Chemical Company) with 13.4 weight percent of bisphenol-A novolac (Epikote DX-175 from Shell Chemical Company) and 11.3 weight percent of tetrabromobisphenol-A with 40 weight percent of methyl ethyl ketone until dissolved. Part 2, an imide solution, is prepared by mixing 60 parts of a commercial MDA-free hydrazide-modified bismaleimide resin with 40 parts of N,N'-dimethyl formamide until dissolved.

The two parts are then mixed together to yield a solution of 30 weight percent epoxy/phenolic solution to 70 weight percent imide solution. The resulting varnish solution is accelerated by adding 0.1 weight percent of 2-methyl imidazole based on total resin solids of the mixed solution. The varnish physical properties are listed in Table 1.

A prepreg was prepared by impregnating a fiberglass mat with the above varnish system in approximately a 1:1 weight ratio of varnish to glass. The impregnated glass was heated in a hot air convection oven at 163° C. for about 2.75 minutes.

An 8-ply, 12×12 inch laminate was then prepared from 8 prepregs cured in a press at 180° C. and 50 psi for 60 minutes. The resulting laminate board was postcured at 200° C. for 2 hours in a forced draft ovren. The laminate had the properties shown in Table 2, column 2.

Additional laminates were prepared as above and post-cured at 2, 4, and 6 hours at 220° C. and 2, 4, and 6 hours at 230° C. Thermal properties after each post-cure time are listed in Table 3.

EXAMPLE 3

A solution of laminating varnish that is currently used in the fabrication of NEMA class FR-4 printed circuit boards was prepared to produce laminate boards that would serve as a control for comparison of laminate properties of preparations according to the invention.

Dicyandiamide was dissolved in propylene glycol monomethyl ether to yield a 6.0 weight percent solution. This solution was mixed with a brominated, bisphenol-A based, epoxy resin solution (EPON Resin 1123-A-80 from Shell Chemical Company). The final varnish solution contained 57.2 weight percent diglycidyl ether of tetrabromobisphenol-A, 1.7 weight percent dicyandiamide, 26.8 weight percent propylene glycol monomethyl ether, and 14.3 weight percent of acetone. This solution was 58.9 weight percent solids. The varnish was then accelerated with 0.1 weight percent 2-methyl imidazole based on total weight of solids.

A prepreg was prepared by impregnating a fiberglass mat with the above varnish system in approximately a 1:1 weight ratio of varnish to glass. The impregnated glass was heated in a hot air oven at 163° C. for about 2.5 minutes.

An 8-ply 12×12 inch laminate was then prepared from 8 prepregs cured in a press at 175° C. and 100 psi for 60 minutes. The laminate properties are shown in Table 2, column 3.

TABLE 1

Physical Properties of Compositions

|  | PART 1 Epoxy/phenolic | PART 2 Imide Solution |
|---|---|---|
| Solvent | Methyl ethyl ketone | Dimethyl formamide |
| Resin Solids, % w | 60 | 60 |
| Epoxide equivalent weight | 365 | NA |
| Specific Gravity, 25 C. | 1.070 | 1.144 |
| Pounds per gallon, 25 C. | 8.91 | 9.53 |
| Viscosity, poise, 25 C. | 0.32 | 1.40 |
| Color | light amber | brown |

Physical Properties of blends of PART 1 and Part 2

| Example No | 1 | 2 |
|---|---|---|
| Weight percent of Part 1 | 50 | 30 |
| Weight percent of Part 2 | 50 | 70 |
| Solids in resulting solution | 60 | 60 |
| Viscosity, poise | 0.37 | 0.56 |
| Specific Gravity | 1.09 | 1.11 |
| Pounds per Gallon | 9.08 | 9.27 |
| Reactivity (time to gel in seconds at 171° C.) | 107 | 127 |

TABLE 2

Properties of Electrical Laminates

|  | EXAMPLE NO | | |
|---|---|---|---|
| PART 1/PART 2 | #1 50/50 | #2 30/70 | #3 CONTROL — |
| FLEXURAL STRENGTH, 23 deg. C., psi | 64000 | 67000 | 68000 |
| FLEXURAL MODULUS, 23 deg. C., psi | 3100000 | 3200000 | 3500000 |
| DIELECTRIC CONSTANT, 23 deg. C., D-24/23 | 4.48 | 4.32 | 4.55 |
| DISSIPATION FACTOR, 23 deg. C., D-24/23 | 0.0098 | 0.0083 | 0.015 |
| DIELECTRIC STRENGTH, 23 deg. C., v/mil | 792 | 765 | 800 |
| VOLUME RESISTIVITY (× 10**16 ohm-cm) | 1.9 | 2.1 | 4 |
| SURFACE RESISTIVITY (× 10**16 ohm-cm) | >1.9 | 3.8 | 6 |
| WATER ABSORPTION, % WT 1 HR 15 PSI STEAM | 0.31 | 0.28 | 0.26 |
| SOLDER SHOCK, 20 secs 500 deg. F., one hr. after 15 psi steam | PASS | PASS | PASS/FAIL |
| METHYLENE CHLORIDE, 30 MIN SOAK, mg* | 1.7 | 1.1 | 71 |
| FLAMMABILITY, UL-94 | VO | VO | VO |
| COPPER PEEL, 1 oz. Cu, lbs/in | 7.7 | 6.9 | 8.0 |
| Tg, DMA, DAMPING MAXIMUM deg. C. | ** | ** | ** |
| TGA, 5% WT. LOSS IN AIR, deg. C. | 335 | 360 | 295 |
| TGA, RESIDUE @ 500 deg. C., % OF INITIAL WT | 84 | 84 | 59.7 |
| Z DIR. CTE, TMA METHOD, ppm/deg C. 10 deg C./min 50 to 250 C., AVG. | 95 | 97 | 220 |

*IPC TEST METHOD 2.3.4.3 (PROPOSED).
**REFER TO POST CURE VERSUS Tg IN TABLE 3

TABLE #3

POST-CURE STUDIES PART 1 AND 2 AT RATIO OF 30/70

|  | GLASS TRANSITION TEMP., DEG. C. (DMA DAMPING PEAK) | |
|---|---|---|
| POST CURE TEMPERATURE, deg. C. | 220 | 230 |
| POSTCURE TIME, HOURS | | |
| 0 | 206 | 206 |
| 2 | 217 | 234 |
| 4 | 236 | 245 |
| 4 | — | 246 |
| 6 | 250 | 259 |

TABLE #3-continued

POST-CURE STUDIES PART 1 AND 2 AT RATIO OF 30/70

|  | GLASS TRANSITION TEMP., DEG. C. (DMA DAMPING PEAK) | |
|---|---|---|
| 6 | — | 261 |

I claim:

1. A method for preparing a solvent-borne thermosettable composition comprising blending compositions comprising
    (a) an epoxy novolac resin solution comprising from about 80 to about 55 weight percent of an epoxy novolac resin, from about 3 to about 10 weight percent of a curing agent for the epoxy novolac resin, said curing agent comprising a phenolic novolac resin, and from about 15 to about 50 weight percent of a first polar organic solvent, based on the weight of the epoxy novolac resin solution; and
    (b) a bismaleimide resin solution comprising from about 30 to about 40 weight percent bismaleimide resin and from about 70 to about 60 weight percent of a second polar organic solvent different from the first polar organic solvent and comprising dimethyl formamide.

2. The method of claim 1 in which the epoxy novalac resin has as average of from about 2 to about 5 vicinal epoxide groups per molecule and a molecular weight greater than about 500.

3. The method of claim 2 which further comprises blending (c) from about 0.05 to about 2 weight pecent of an imidazole.

4. The method of claim 2 in which the first polar solvent is methyl ethyl ketone.

5. The method of claim 4 in which the phenolic novolac resin is a bisphenol-A novolac having a weight per phenolic group of about 60 to about 500 and an average of more than about 2 phenolic hydroxyl groups per molecule.

6. The method of claim 1 in which the bismaleimide resin is an N,N'-unsaturated bismaleimide.

7. The method of claim 3 in which the imidazole is 2-methyl imidazole.

8. The method of claim 7 in which the bismaleimide is N,N'-4,4'-diphenylmethane bismaleimide.

9. The method of claim 1 in which the epoxy resin is a normally-solid bisphenol-A novolac epoxy resin.

* * * * *